Oct. 7, 1969 L. J. QUINTANA 3,471,631

FABRICATION OF MICROMINIATURE MULTILAYER CIRCUIT BOARDS

Filed April 3, 1968

INVENTOR.
LEO J. QUINTANA
BY Harry A. Herbert Jr and Ruth Coslier
ATTORNEYS

United States Patent Office 3,471,631
Patented Oct. 7, 1969

3,471,631
FABRICATION OF MICROMINIATURE MULTILAYER CIRCUIT BOARDS

Leo J. Quintana, Orange, Calif., assignor to the United States of America as represented by the Secretary of the United States Air Force Filed Apr. 3, 1968, Ser. No. 718,611
Int. Cl. H05k *1/02*
U.S. Cl. 174—68.5 4 Claims

ABSTRACT OF THE DISCLOSURE

A product and method for fabricating a sequentially laminated multilayer circuit board with chemically drilled holes and electroplated interconnections. The interconnecting holes are off-set to the right and to the left in the alternating laminations. Microminiature circuits are thus produced in three dimensions, with greater circuit density at less cost than has heretofore been possible.

Background of the invention

This invention relates generally to the fabrication of multilayer interconnected circuit boards. Multilayer circuit boards are presently being fabricated by a number of processes. Holes are drilled mechanically through the circuit board. Plated-thru holes and alloy filled holes are in use for the conducting medium from one lamination to another. There is mechanical breakage attendant upon the mechanical drilling of the holes, and the process is time-consuming and expensive. The plated-thru hole technique does not in itself provide for a sufficient circuit density. The alloy filled hole process is capable of producing greater circuit densities, but this process is very costly, accounting for approximately one-half the material cost of the board. Accomplishing this process is also time-consuming and costly.

Summary of the invention

A circuit is produced in three dimensions comprised of printed circuit boards in laminated relationship having a circuit of standard grid pattern functioning between the layers, and printed on one of the abutting laminations. Plated-thru holes carry the conductive connection from one layer to another. The hole patterns are shifted to the right and to the left alternately in alternate laminations. By this method it is possible to produce a micro module of greater density than has hitherto been produced.

The objects of the invention are to produce a micro module of greater density at a much lower cost than has heretofore been possible.

The steps in the process in summary form are as follows: A nonconducting plate, such as epoxy glass, is copper coated on both sides, and may be used to form the central layer of a laminated block. Subsequent abutting laminations will have photo-etching and plating on the exposed side only. If a photosensitive resin or lacquer is used, this first double-clad plate is coated with it and the hole pattern is applied and exposed. The holes are of the order of .0125''. This pattern is shifted to a distance of the order of .010'' to the right or to the left of the normal grid pattern.

The hole pattern is etched by a suitable copper etchant such as ferric chloride. Then the holes are chemically drilled or etched through the epoxy glass substance of the plate by any suitable etchant, such as sulfuric acid and hydrofluoric acid. Any overhanging fringe of copper is removed by again exposing the unit to the copper etchant material. The copper plating on the lower surface of the board is left intact. The holes are then plated-thru. A thin layer of copper is applied by chemical means, and then a layer of copper is applied to both hole and upper surface by electroplating. The holes are filled with epoxy resin or equivalent and the epoxy is cured to protect the plating in the holes during subsequent etching processes. The circuit pattern is then imprinted on the surface in any desired manner and the surface copper is etched away with ferric chloride, or equivalent etching material, leaving the circuit imprinted in copper on the plate. The plated-thru holes contact the circuit pads, but are positioned to the right. Laminations are then added.

One method is to add a single clad board to each side of the treated board with the unclad surfaces inward. This laminated unit now presents opposite coppered surfaces and is subjected to the steps of the process outlined above. The hole pattern will again be shifted. If, in the first instance the shift was to the right, it will now be shifted to the left. Further laminations are applied as desired with the hole patterns applied to alternate pairs of layers being shifted alternately to the right and to the left.

Other combinations of hole pattern shift and grid pattern shift may be worked out within the scope of the invention.

The treatment of the holes in the final layer is optional. They may be filled with resin, spray-metal filled, alloy filled, left unfilled, or treated in any other manner found desirable.

These and other advantages, features and objects of the invention will become more apparent from the following description taken in connection with the illustrative embodiment in the accompanying drawings, wherein:

Description of the drawings

In the drawings, the FIGURES 1 to 7 show the successive steps in the process beginning with step IV, which is the chemical drilling of the holes in the epoxy glass plate and continuing to the final steps of laminating a series of plated-thru boards.

Description of the preferred embodiment

Figure 1:
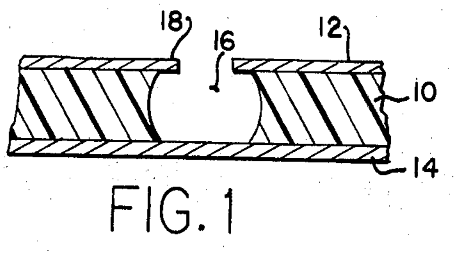
Figure 2:
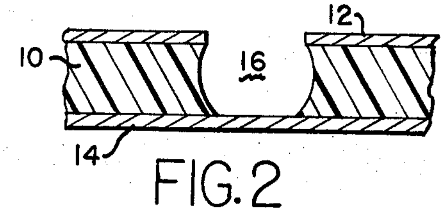
Figure 3:
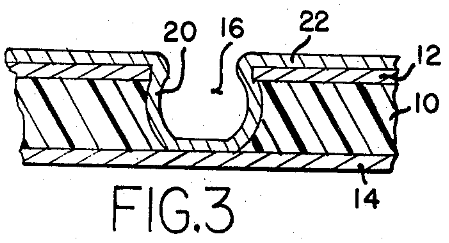
Figure 4:
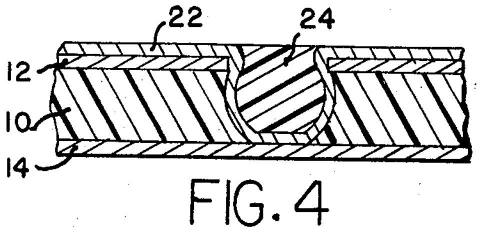

The process is described in twelve steps.

*Step I.*—A sheet of epoxy glass, or equal, 10 is coated on both sides with a layer of copper shown at 12 and 14 in FIGURES 1, 2, 3 and 4 of the drawing. It is then coated with a photosensitive lacquer.

*Step II.*—The hole pattern is light exposed on the top side 12 of the board 10. The holes are of the order of .0125'' in diameter, and the hole pattern is shifted to the right of the normal grid pattern. The shift is of the order of .010''.

*Step III.*—The hole pattern is now established in the copper layer 12, and the etching is accomplished by means of ferric chloride or other suitable etchant for etching in copper.

*Step IV.*—The holes 16 are etched through the epoxy glass by a suitable glass etchant such as $H_2SO_4+HF$. The hole 16 is thus chemically drilled through the epoxy glass plate 10, leaving intact the copper plate 14. FIGURE 1 of the drawing shows the plate 10 at this point in the process.

*Step V.*—The hole 16 is left with an overhanging fringe of copper 18, and this is removed by placing the board in the etchant again, suitable techniques being employed to keep the lower layer intact as indicated above.

*Step VI.*—The holes 16 are then plated-thru by an electroless technique to provide a layer of copper 20. A layer of copper 22 is then deposited by electroplating over the layer 12.

*Step VII.*—The holes 16 are now filled with epoxy resin, or any other termo-setting resin, which is then oven cured. The time found effective is from 5–10 minutes, but the invention is not so limited. The purpose is the protection of the copper plating in the holes from corrosion in subsequent etching processes.

*Step VIII.*—The whole board 10 is now coated on both sides with photosensitive resin, such as KPR, and the circuit pattern is exposed.

Figure 5:
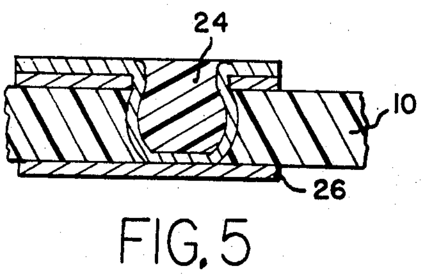
Figure 6:
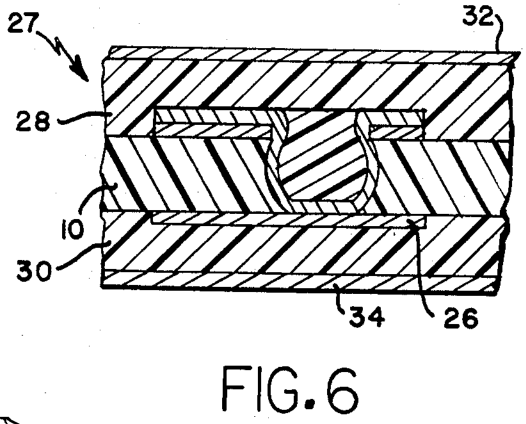

*Step IX.*—Ferric chloride or equivalent is used for etching away the unexposed copper and establishing the circuit on both sides of the board 10. The pattern is designed and placed so that the plated-thru holes 16, with their conducting plating 20 are now located to the right of the remaining portion of copper which is now the conducting pad 26. It will be seen that their position is almost tangent to the circuit carrying element 26. See FIGURES 5, 6 and 7.

*Step X.*—A laminated unit 27 is now formed by placing single clad epoxy layers 28 and 30 in juxtaposition on each side of the board 10. The boards 28 and 30 carry copper layers 32 and 34, respectively, which form the outer surfaces of the new unit 27, see FIGURE 6.

*Step XI.*—The exposed surfaces 32 and 34 are coated with photosensitive material such as KPR and each is light exposed in a hole pattern which has been shifted to the left of the normal grid pattern a distance of the order of .010″.

Figure 7:
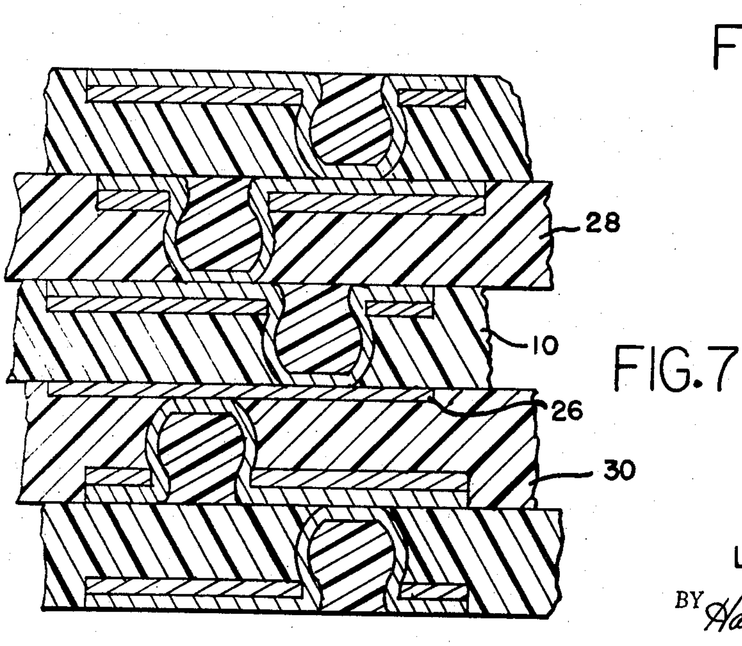

*Step XII.*—The desired hole pattern is thus imprinted on the surfaces 32 and 34; etching is done and Steps III through X are repeated until the desired number of circuit layers has been achieved. FIGURE 7 shows a laminated block of five layers. It will be noted that the hole patterns are shifted in the pairs of alternate laminations, alternately to the right and to the left.

It will thus be realized that a greater density can be accomplished by this means than the now known processes.

I claim:

1. A laminated multilayer circuit board comprising a center plate of nonconducting material having plated-thru holes and a circuit of standard grid pattern imprinted on both sides, the plated-thru hole pattern being shifted to one side of the standard grid pattern and providing conduction from one lamination to another, a second plate and a third plate of nonconducting material placed in abutting relationship on either side of said center plate, plated-thru holes in said second and third plates, a printed circuit of standard form imprinted on each of said second and third plates on the exposed side of each plate, said plated-thru holes in said second and third nonconducting plates, forming conduction from the circuits of the central plate to those of the second and third plates, the plated-thru holes of said second and third plates being shifted in a direction opposite to the direction of shift above noted.

2. A device as claimed in claim 1 including further, single clad laminations placed in abutting relationship to the said second and third plates, the hole patterns of successive pairs of laminations being shifted alternately to the right and to the left.

3. The method of fabricating laminated multilayer circuit boards, said method comprising the steps of:

(1) etching a hole pattern in the copper on the upper side of a double clad epoxy glass circuit board, the hole pattern being shifted to the right in relation to a standard circuit pattern to be later imprinted on each side of said board;

(2) drilling holes in the epoxy glass circuit board by chemical means and from the upper side only, leaving intact the copper plating on the lower side of the board;

(3) copper plating the surfaces of the holes thus drilled;

(4) filling the holes with thermo setting resin;

(5) coating the board on the upper side with photosensitive resin and exposing it to a circuit pattern;

(6) etching a circuit pattern in upper and lower copper layers, the plated-thru holes positioned in conducting continuity relationship to the conducting elements of the circuits, and shifted to the right;

(7) laminating both sides of the circuit board with a single copper clad epoxy glass board, the copper coated sides of the boards being placed outward;

(8) etching holes in both boards thus added as per step (1);

(9) drilling holes in the added boards by chemical means as per step (2);

(10) copper plating as per step (3);

(11) filling holes as per step (4);

(12) coating both exposed sides with photosensitive resin and exposing said laminated board to a circuit pattern;

(13) repeating step (6), shifting the hole pattern to the left.

4. The process as claimed in claim 3, wherein further laminations are added by repeating steps (7) through (13), shifting the hole pattern in alternate layers alternately to the right and to the left.

References Cited

UNITED STATES PATENTS

| | | | |
|---|---|---|---|
| 3,264,402 | 8/1966 | Shaheen et al. ______ | 174—68.5 |
| 3,319,317 | 5/1967 | Roche et al. ____ | 174 68.5 XR |

DARRELL L. CLAY, Primary Examiner

U.S. Cl. X.R.

317—101; 29—625; 156—3